(12) United States Patent
Chida et al.

(10) Patent No.: US 11,096,300 B2
(45) Date of Patent: Aug. 17, 2021

(54) BUS BAR AND BUS BAR FIXATION STRUCTURE

(71) Applicant: Yazaki Corporation, Tokyo (JP)

(72) Inventors: Chiaki Chida, Shizuoka (JP); Akinori Maruyama, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/917,022

(22) Filed: Jun. 30, 2020

(65) Prior Publication Data

US 2020/0337170 A1 Oct. 22, 2020

Related U.S. Application Data

(63) Continuation of application No. PCT/JP2019/000747, filed on Jan. 11, 2019.

(30) Foreign Application Priority Data

Jan. 26, 2018 (JP) .............................. JP2018-011334

(51) Int. Cl.
*H05K 7/14* (2006.01)
(52) U.S. Cl.
CPC ...................................... *H05K 7/14* (2013.01)
(58) Field of Classification Search
CPC ....................................................... H05K 7/14
USPC ........................................................ 174/68.2
See application file for complete search history.

(56) References Cited

U.S. PATENT DOCUMENTS

| | | | | |
|---|---|---|---|---|
| 6,302,709 B1* | 10/2001 | Ross | ........................ | H01R 4/34 439/78 |
| 7,888,601 B2* | 2/2011 | Bax | ......................... | H01R 4/30 174/252 |
| 2011/0222254 A1* | 9/2011 | Iyatani | .................... | B60T 8/368 361/767 |
| 2015/0140391 A1* | 5/2015 | Sakate | ................... | H01M 2/204 429/121 |
| 2016/0141770 A1* | 5/2016 | Hoehn | ..................... | H01R 4/34 361/747 |
| 2016/0242308 A1* | 8/2016 | Nakazawa | ........... | H05K 7/1407 |
| 2016/0314879 A1 | 10/2016 | Ozaki | | |
| 2018/0151862 A1 | 5/2018 | Bessho et al. | | |

FOREIGN PATENT DOCUMENTS

| | | |
|---|---|---|
| JP | 08-69826 A | 3/1996 |
| JP | 08-78867 A | 3/1996 |
| JP | 11-26040 A | 1/1999 |
| JP | 2015-126109 A | 7/2015 |
| WO | 2017017915 A1 | 2/2017 |

\* cited by examiner

*Primary Examiner* — Sherman Ng
(74) *Attorney, Agent, or Firm* — Sughrue Mion, PLLC (57) ABSTRACT

A bus bar includes: a fixing portion fixed to a fixing member; extending portions individually extending from the fixing portion; terminal portions extending from tips of the extending portions respectively and fixed and electrically connected to a substrate with the terminal portions inserted in terminal insertion holes of the substrate; and curved portions provided in the extending portions respectively.

6 Claims, 7 Drawing Sheets

BUS BAR AND BUS BAR FIXATION STRUCTURE

CROSS REFERENCE TO RELATED APPLICATION

This application is a Continuation of PCT Application No. PCT/JP2019/000747, filed on Jan. 11, 2019, and claims the priority of Japanese Patent Application No. 2018-011334, filed on Jan. 26, 2018, the content of which is incorporated herein by reference.

BACKGROUND

Technical Field

The disclosure relates to a bus bar that is electrically connected to a substrate and fixes the substrate to a fixing member, and a bus bar fixing structure using the bus bar.

Background Art

JP 2015-126109 A discloses an electronic component that is electrically connected to a substrate and fixes the substrate to a fixing member. The electronic component includes a fixing portion having a screw through hole, a box-shaped positioning portion extending from the fixing portion, and a pair of terminal portions extending from the positioning portion at a side opposite to the fixing portion.

The positioning portion includes a pair of side walls and four substrate receiving portions protruding from the front and rear positions of each side wall outward to the right and left sides. The pair of side walls is formed to have the height so as to protrude above the four substrate receiving portions. The four substrate receiving portions are formed at the same height position.

The substrate is formed to have a pair of terminal through holes and a recessed portion which the pair of side walls enters. The substrate has a substrate tab portion via a connection portion prior to fixing the electronic component to the substrate.

The fixing member is provided with a protrusion which protrudes with respect to a peripheral surface of the fixing member.

Next, assembling of a fixing structure using the electronic component is described. The pair of terminal portions of the electronic component is inserted in the pair of terminal through holes of the substrate while the pair of side walls of the electronic component is engaged with the recessed portion and the four substrate receiving portions are placed on a surface of the substrate. Through this process, a position of the electronic component in a surface direction of the substrate is positioned by the pair of side walls. A position of the electronic component in a thickness direction of the substrate is positioned by the four substrate receiving portions.

In this state, reflow soldering is performed. The pair of terminal portions is electrically connected to the substrate by solder. Next, the substrate tab portion of the substrate is removed at the connection portion. Next, the electronic component is set at a fixing position of the fixing member and then the fixing portion of the electronic component is fastened to the protrusion of the fixing member by a screw, thereby the assembling is completed. The electronic component fixed to the substrate, as described above, is fixed at a precise position with respect to the substrate and thus the fixing portion of the electronic component is also fixed at a predetermined proper position with respect to the substrate. Accordingly, the fixing portion of the electronic component can be securely fixed to the fixing member.

SUMMARY

The electronic component described above has a complicated structure because the electronic component needs to be provided with the positioning portion which has the pair of side walls and the four substrate receiving portions. Therefore, a dedicated mold is required and thus the cost of the electronic component is high.

The disclosure is directed to a bus bar and a bus bar fixing structure using the same which have an uncomplicated structure and are low in cost.

A bus bar in accordance with some embodiments includes: a fixing portion fixed to a fixing member; extending portions individually extending from the fixing portion; terminal portions extending from tips of the extending portions respectively and fixed and electrically connected to a substrate with the terminal portions inserted in terminal insertion holes of the substrate; and curved portions provided in the extending portions respectively.

A bus bar fixing structure in accordance with some embodiments includes: a substrate; a fixing member; and a bus bar which is electrically connected to the substrate and fixes the substrate to the fixing member. The bus bar includes: a fixing portion fixed to the fixing member; extending portions individually extending from the fixing portion; terminal portions extending from tips of the extending portions respectively and fixed and electrically connected to the substrate with the terminal portions inserted in terminal insertion holes of the substrate; and curved portions provided in the extending portions respectively.

According to the above configuration, the terminal portions are inserted in the terminal insertion holes of the substrate, whereby the bus bar is positioned in a surface direction of the substrate by the terminal portions. Deformation of the curved portions, which are easily flexurally deformable, absorbs a displacement in position in a thickness direction of the substrate if any when the fixing portion of the bus bar is fixed to the fixing member, whereby the fixing portion of the bus bar can be securely fixed to the fixing member. Further, the curved portions may be formed between the terminal portions and the fixing portion respectively, whereby the bus bar becomes uncomplicated in structure and the cost of the mold is also low.

DETAILED DESCRIPTION

Description will be hereinbelow provided for an embodiment of the present invention by referring to the drawings.

Figure 1A:
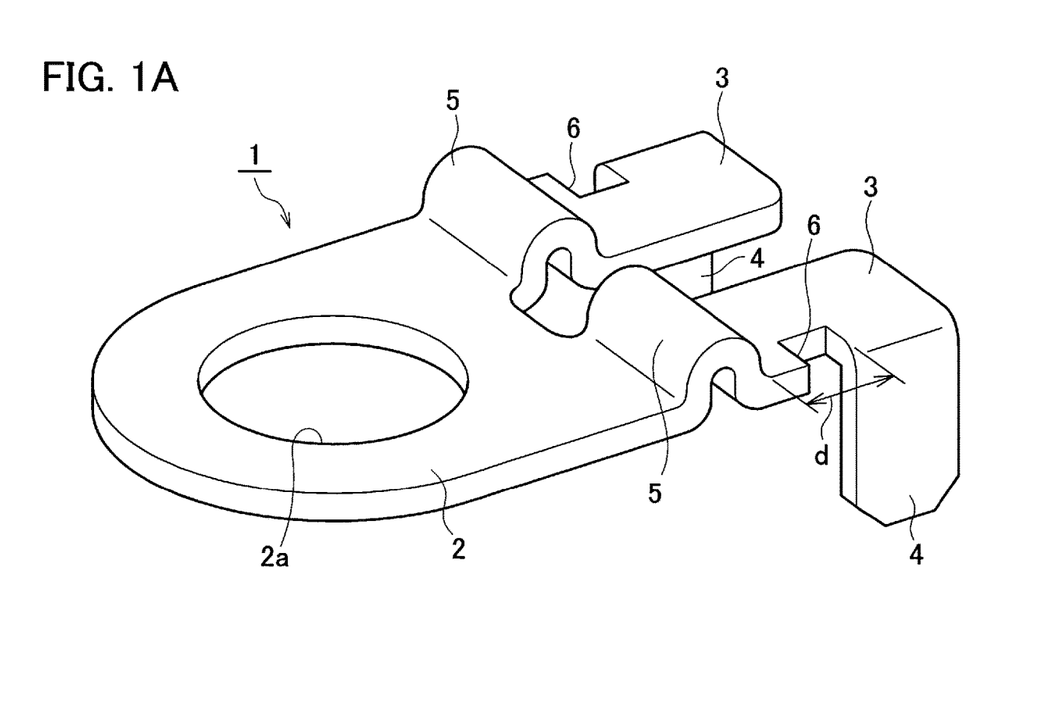
FIG. 1A is a perspective view of a bus bar according to an embodiment of the present invention.

FIGS. 1A to 7C illustrate an embodiment of the present invention. As illustrated in FIGS. 1A and 1B, a bus bar 1 is formed by cutting a plate member made of a conductive member such as cupper into a predetermined shape and then bending the plate member as cut into a predetermined shape.

Figure 1B:
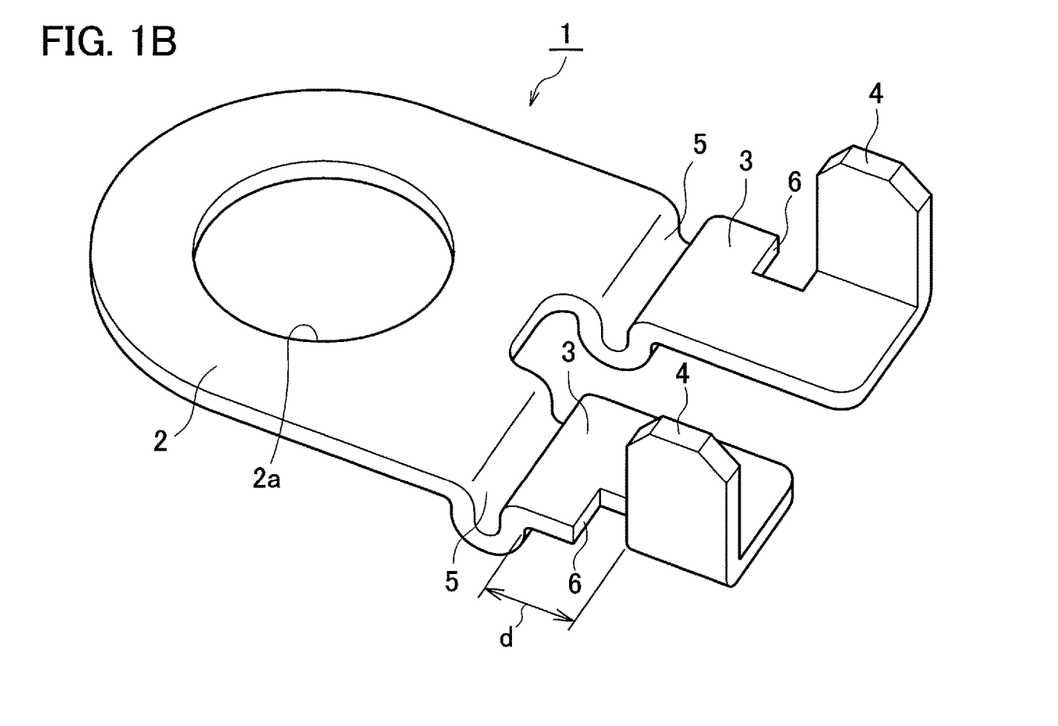
FIG. 1B is a perspective view of the bus bar viewed from a side opposite to FIG. 1A.

The bus bar 1 includes a fixing portion 2 fixed to a chassis 20 as a fixing member, two extending portions 3 independently and individually extending from the fixing portion 2, and two terminal portions 4 provided in tips of the extending portions 3 respectively.

The fixing portion 2 is formed in an arc shape at the front side thereof and in a rectangular shape at the rear side thereof when viewed from above. The center of the fixing portion 2 is formed with a screw through hole 2a concentric with the arc shape.

The two extending portions 3 extend rearward in parallel to each other from the rear end of the fixing portion 2. The extending portions 3 are formed with curved portions 5 as bent portions at positions of the extending portions 3 proximal to the portions of the fixing portion 2 from which the extending portions 3 extend, respectively. Each of the curved portion 5 has a substantially semi-elliptical section. Each of the curved portions 5 has a shape curving in a space opposite to an extending direction of the terminal portion 4 with respect to the extending portions 3, that is, a space above a surface defined by the two extending portions 3. Recessed portions 6 are formed in the extending portions 3 at positions toward the tips thereof from the curved portions 5 respectively. The recessed portions 6 are formed in outer edges (outer edges viewed from each of the two extending portions 3) of the two extending portions 3 respectively.

The terminal portions 4 are provided in the extending portions 3 at positions toward the tips thereof from the recessed portions 6 and extend from the tips of the extending portions 3 respectively. Thus, the terminal portions 4 are arranged at positions apart from the curved portions 5 by a dimension d respectively. The terminal portions 4 are formed in the outer edges (outer edges viewed from each of the two extending portions 3) of the two extending portions 3 respectively and formed by being bent at a right angle at the outer edges respectively.

Next, a bus bar fixing structure using the bus bar 1 is described. The bus bar fixing structure is a structure in which the bus bar 1 is electrically connected to a substrate 10 and the substrate 10 is fixed to the chassis 20 as the fixing member via the bus bar 1. In the embodiment, the bus bar 1 is a ground terminal via which the chassis 20 is grounded. Details are described below.

Figure 2:
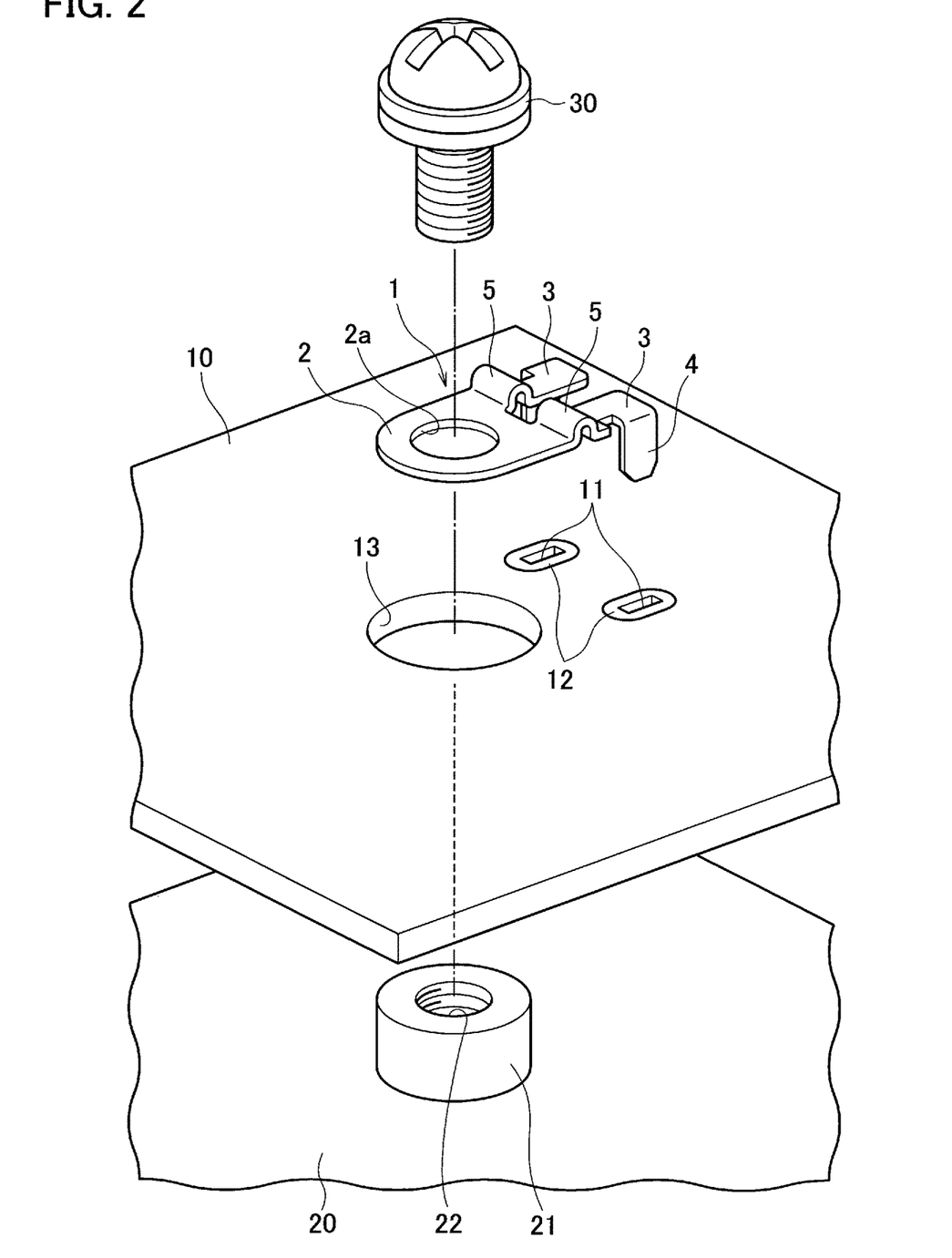
FIG. 2 is an exploded perspective view of a bus bar fixing structure according to an embodiment of the present invention.
Figure 3:
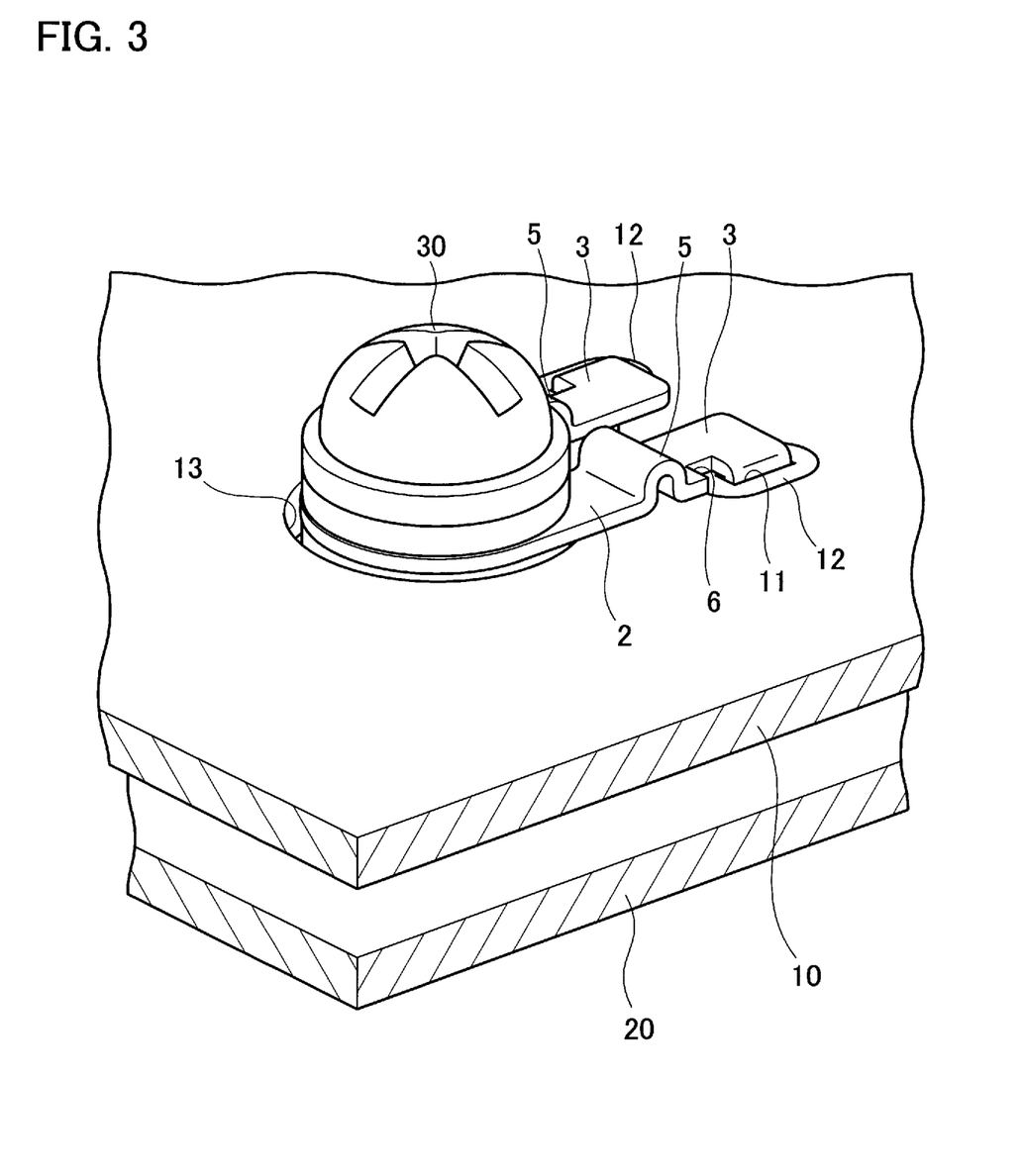
FIG. 3 is a perspective view of the bus bar fixing structure according to the embodiment of the present invention.

As illustrated in FIGS. 2 and 3, the bus bar fixing structure includes the substrate 10, the chassis 20 as the fixing member, and the bus bar 1 which is electrically connected to the substrate 10 and fixes the substrate 10 to the chassis 20.

The substrate 10 is formed to have a circuit pattern (unillustrated) by printing or the like. The substrate 10 is formed to have terminal insertion holes 11 at two locations thereof. The terminal insertion holes 11 at the two locations are arranged in parallel to each other at positions and with sizes such that the two terminal portions 4 are tightly inserted in the terminal insertion holes 11. Grounding lands 12 are formed at the peripheries of the terminal insertion holes 11 respectively. The grounding lands 12 are formed as a part of the circuit pattern described above. The substrate 10 is formed to have a circular through hole 13 in the vicinity of the terminal insertion holes 11. The through hole 13 is formed in a size such that the tip of the fixing portion 2 of the bus bar 1 can enter.

The chassis 20 is provided with a cylindrical protrusion 21 which protrudes with respect to a surface of the chassis 20 around the cylindrical protrusion 21. The cylindrical protrusion 21 is formed to have a threaded screw hole 22. The portion where the threaded screw hole 22 is formed is formed of a conductive member (unillustrated).

Figure 4:
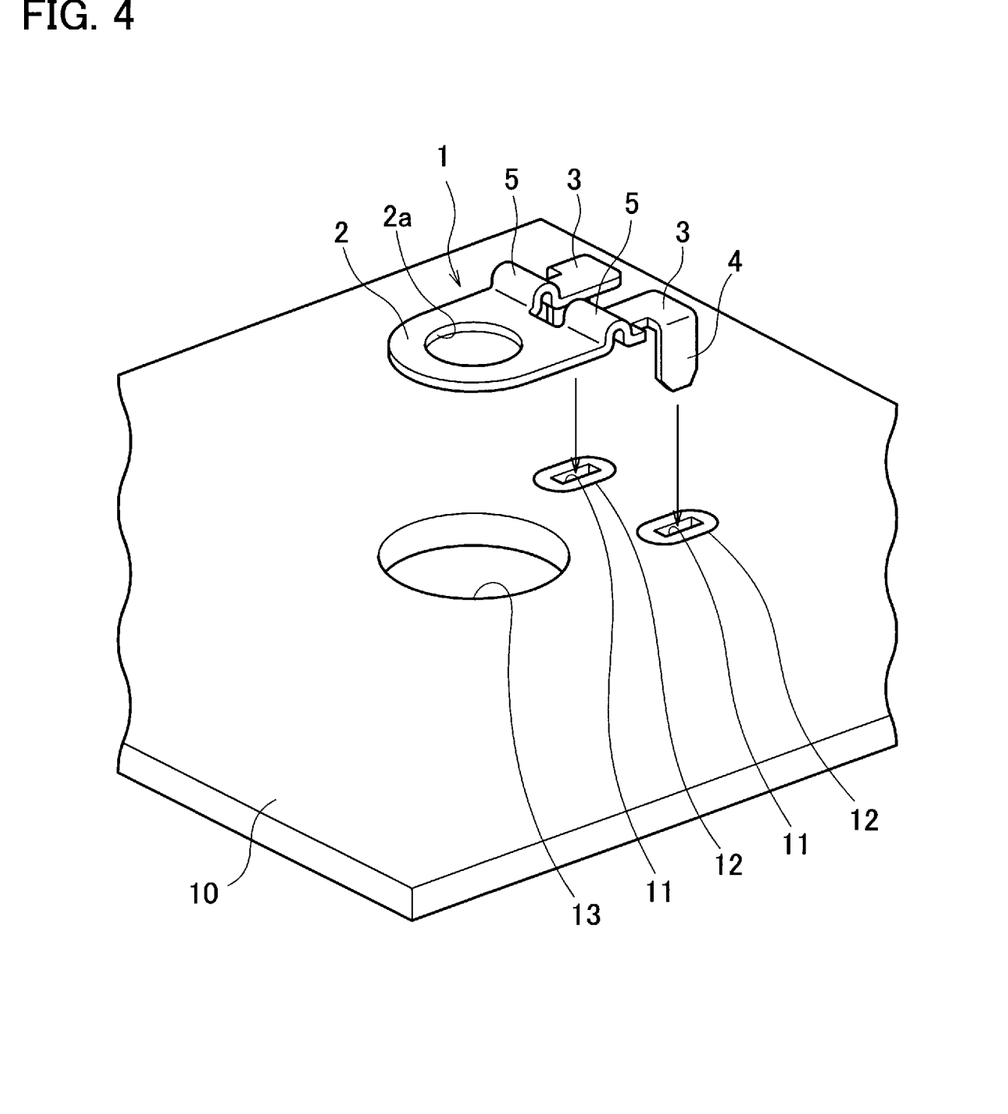
FIG. 4 is a perspective view illustrating a process of inserting the terminal portions of the bus bar in terminal through holes of a substrate according to the embodiment of the present invention.
Figure 5:
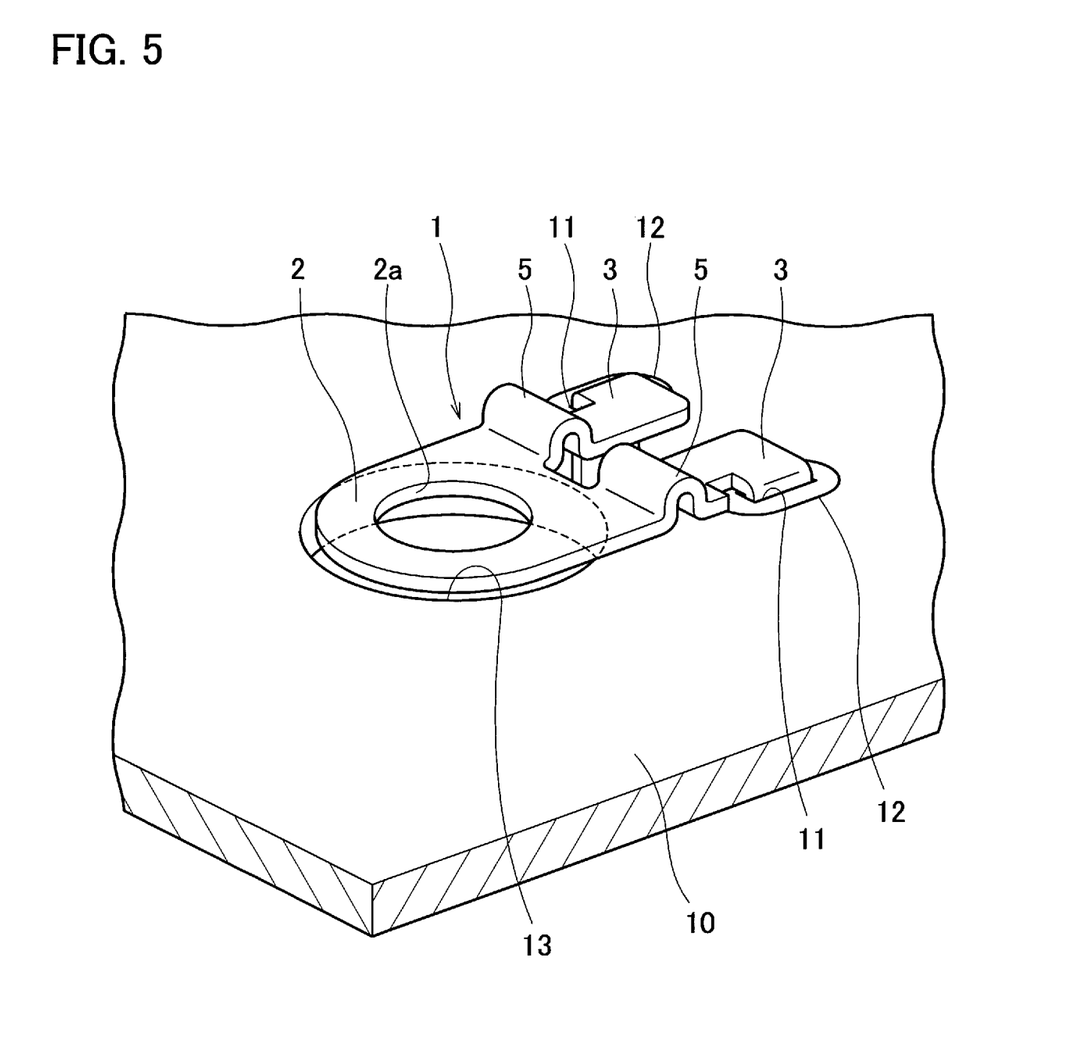
FIG. 5 is a perspective view illustrating a state where the bus bar is electrically connected to the substrate by soldering the terminal portions of the bus bar to the substrate according to the embodiment of the present invention.

Next, assembly procedures of the bus bar fixing structure will be described. As illustrated in FIG. 4, the terminal portions 4 of the bus bar 1 are inserted in the terminal insertion holes 11 of the substrate 10 respectively. Then, reflow soldering is performed on the substrate 10 on which the other electronic component (unillustrated) is mounted. Thus, as illustrated in FIG. 5, the bus bar 1 is fixed to the substrate 10 by solder (unillustrated) and the bus bar 1 is electrically connected to the grounding lands 12 of the substrate 10 by solder (unillustrated).

Figure 6:
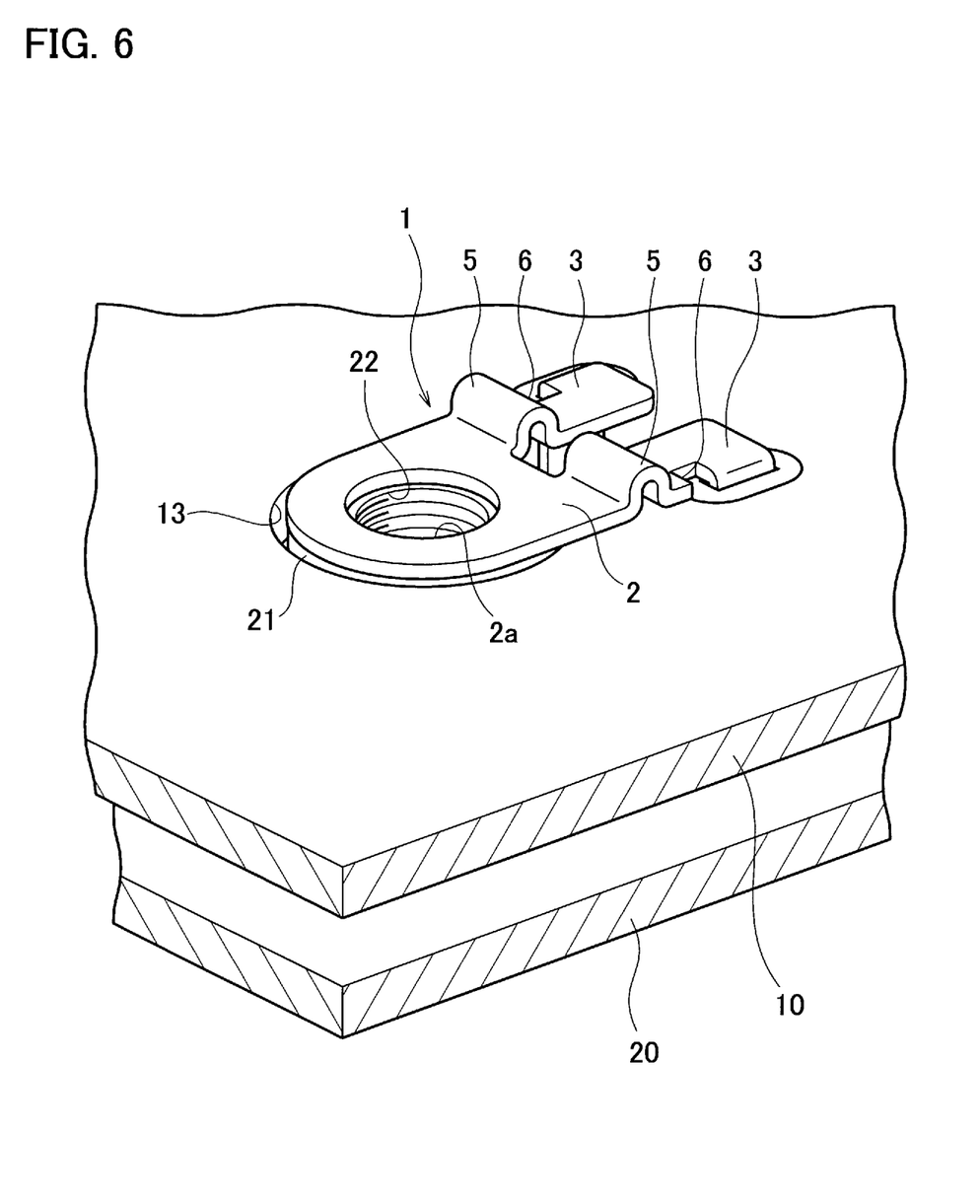
FIG. 6 is a perspective view illustrating a state where a protrusion of a chassis is inserted in a through hole of the substrate according to the embodiment of the present invention.

Next, as illustrated in FIG. 6, the substrate 10 is arranged at a predetermined substrate mounting position of the chassis 20. Thus, the protrusion 21 of the chassis 20 is inserted in the through hole 13 of the substrate 10 and it goes into a state where the protrusion 21 of the chassis 20 is exposed from the through hole 13 of the substrate 10.

Next, a screw 30 is threaded into the threaded screw hole 22 of the protrusion 21 through the screw through hole 2a of the fixing portion 2 from above of the substrate 10. With the above procedures, assembly of the bus bar fixing structure is completed.

Even when there is a displacement between the two terminal portions and the two terminal insertion holes 11 in the process where the substrate 10 is arranged at the predetermined substrate mounting position of the chassis 20 during the assembly procedures above, the two terminal portions 4 are capable of absorbing the displacement because the two terminal portions 4 are provided in the fixing portion 2 via the extending portions 3, which are independent from each other, and thus the two terminal portions 4 are independently displaceable to a certain degree. After the soldering, the bus bar 1 is positioned in a surface direction of the substrate 10 by the two terminal portions 4 due to insertion of the two terminal portions 4 in the terminal through holes 11 of the substrate 10 respectively.

Figure 7A:
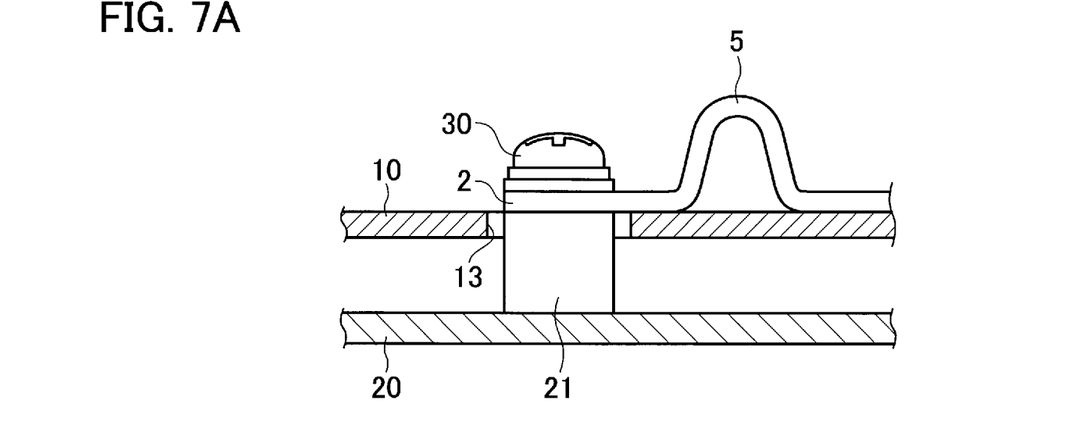
FIG. 7A is a sectional view illustrating a state where a fixing portion of the bus bar is fastened to the protrusion of the chassis by a screw with a height of the protrusion of the chassis equal to a level of an upper surface of the substrate according to the embodiment of the present invention.

When the substrate 10 is positioned at the proper mounting position with respect to the chassis 20 in the process of fastening the screw 30 during the assembly procedures above, the upper surface of the substrate 10 and the upper surface of the protrusion 21 of the chassis 20 are at the same height as illustrated in FIG. 7A, and thus the screw 30 can be fastened without any deformation of the bus bar 1.

Figure 7B:
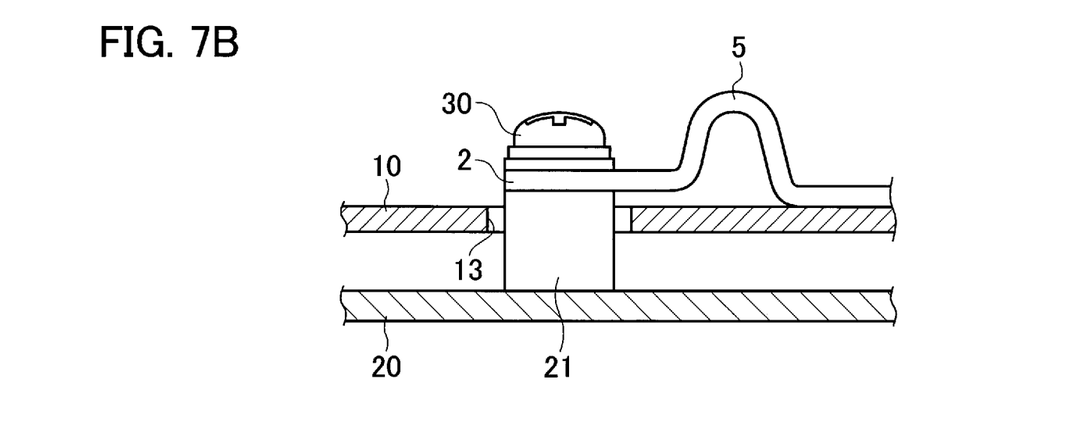
FIG. 7B is a sectional view illustrating a state where a fixing portion of the bus bar is fastened to the protrusion of the chassis by a screw with a height of the protrusion of the chassis above a level of an upper surface of the substrate according to the embodiment of the present invention.
Figure 7C:
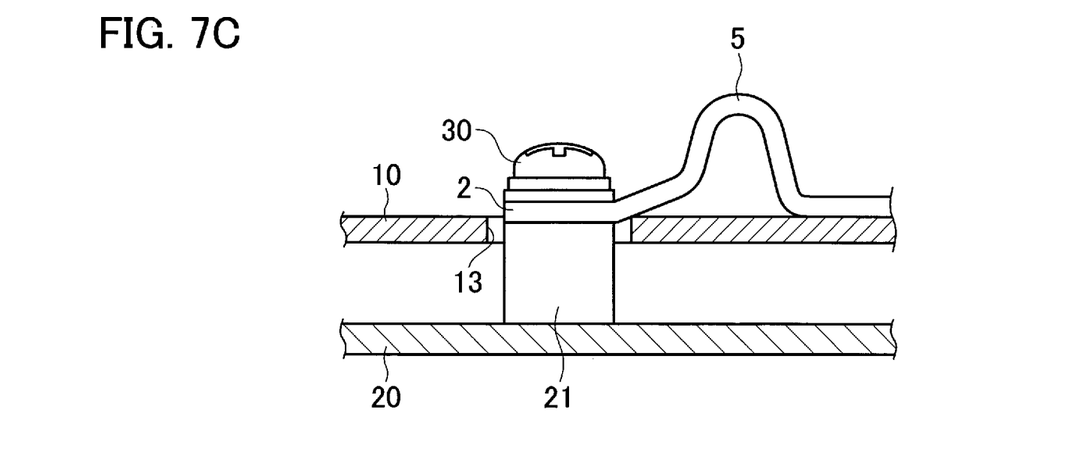
FIG. 7C is a sectional view illustrating a state where a fixing portion of the bus bar is fastened to the protrusion of the chassis by a screw with a height of the protrusion of the chassis below a level of an upper surface of the substrate according to the embodiment of the present invention.

When the substrate 10 is positioned at a position displaced in the thickness direction of the substrate 10 from the proper mounting position with respect to the chassis 20, specifically when the upper surface of the protrusion 21 of the chassis 20 is higher than the upper surface of the substrate 10 as illustrated in FIG. 7B or when the upper surface of the protrusion 21 of the chassis 20 is lower than the upper surface of the substrate 10 as illustrated in FIG. 7C, the bus bar 1 is capable of absorbing the displacement in the height direction of the fixing portion 2 by flexural deformation of the two curved portions 5 which are provided in the bus bar 1 and easily flexurally deformable. The deformation of the curved portions 5 of the bus bar 1 enables the screw 30 to be fastened without too much force.

As described above, the bus bar 1 includes: the two terminal portions 4 individually extending from the fixing portion 2 respectively and electrically connected to the substrate 10 with the terminal portions 4 inserted in the terminal insertion holes 11 of the substrate 10; and the two curved portions 5 provided in the portions extending from the fixing portion 2 to the terminal portions 4 respectively.

Accordingly, as described above, the bus bar 1 is positioned in the surface direction of the substrate 10 by the two terminal portions 4 due to insertion of the two terminal portions 4 in the terminal through holes 11 of the substrate 10 respectively. When the fixing portion 2 of the bus bar 1 is fixed to the chassis 20, if there is a displacement in the thickness direction of the substrate 10, the displacement is absorbed by deformation of the curved portions 5 which are easily flexurally deformable. Thus, the fixing portion 2 of the bus bar 1 can be securely fixed to the chassis 20. Furthermore, since it only has to form the curved portions 5 between the terminal portions 4 and the fixing portion 2 respectively, the bus bar 1 becomes uncomplicated in structure and the cost of the bus bar 1 also becomes low due to the low cost of the mold for the bus bar 1.

A rotation moment is applied to the bus bar 1 at the time of fastening or unfastening the screw 30. However, deformation of the curved portions 5 due to the rotation moment decreases stress applied to the terminal portions 4. Thus, problems such as solder cracks or the like can be prevented as much as possible. Furthermore, the terminal portions 4 are provided at the positions apart from the curved portions 5 by the dimension d respectively. Thus, stress due to deformation of the curved portions 5 is not directly applied to the terminal portions 4 and stress applied to the terminal portions 4 is decreased. Also in the process of soldering, stress applied to the terminal portions 4 by the curved portions 5 is decreased and thus soldering becomes easier than the case where the terminal portions 4 are continuously provided from the curved portions 5 without a space.

Furthermore, the recessed portions 6 are formed at the locations of the extending portions 3 between the curved portions 5 and the terminal portions 4. The extending portions 3 have decreased widths at the portions in which the recessed portions 6 are formed and thus the portions are deformable easier than the other portions of the extending portions 3. Therefore, stress applied to each of the terminal portions 4 is decreased.

The bus bar 1 can be arranged at the position of the substrate 10 at which the terminal insertion holes 11 and the through hole 13 are provided. Thus, the bus bar 1 can be arranged at a given position of the substrate 10 instead of at the edge face of the substrate 10 and therefore the degree of freedom of arrangement position of the bus bar 1 is high.

In the embodiment, each of the bent portions (curved portions 5) is formed to have a curved shape of a substantially semi-elliptical section. However, each of the bent portions may be formed to have any bent shapes which are easily flexurally deformable. Furthermore, in the embodiment, each of the bent portions (curved portions 5) has a shape with a single curved portion. However, each of the bent portions may have a shape with curved portions continuously formed.

In the embodiment, the bus bar 1 is provided with the two extending portions 3 and the two terminal portions 4. However, the bus bar 1 may be provided with three or more extending portions 3 and three or more terminal portions 4.

In the embodiment, the bus bar 1 is a grounding terminal. However, the bus bar 1 may be a joint terminal or the like.

In this way, the present invention includes various embodiments not described above. Therefore, the scope of the present invention is determined only by the invention identification matters according to claims reasonable from the foregoing description.

What is claimed is:

1. A bus bar comprising:
a fixing portion fixed to a fixing member;
extending portions individually extending from the fixing portion;
terminal portions extending from tips of the extending portions respectively and fixed and electrically connected to a substrate with the terminal portions inserted in terminal insertion holes of the substrate;
curved portions provided in the extending portions respectively; and
recessed portions provided in the extending portions at positions toward the tips of the extending portions from the curved portions and formed in outer edges of the extending portions respectively, and
wherein the fixing portion, extending portions, terminal portions, curved portions and recessed portions are formed as one piece,
wherein the fixing portion has a screw through hole, and
wherein the fixing portion is fixed to the fixing member by a screw threaded through the screw through hole into a protrusion of the fixing member located at a through hole of the substrate.

2. The bus bar according to claim 1, wherein
the extending portions extend in parallel to each other from the fixing portion, and
the terminal portions extend from the tips of the extending portions respectively in a direction at a right angle to the extending portions.

3. The bus bar according to claim 1, wherein the curved portions curve in a space opposite to an extending direction of the terminal portions with respect to the extending portions.

4. The bus bar according to claim 1, wherein the terminal portions are formed in the outer edges of the extending portions by being bent at a right angle at the outer edges respectively.

5. A bus bar fixing structure comprising:
a substrate;
a fixing member; and
a bus bar which is electrically connected to the substrate and fixes the substrate to the fixing member,
wherein the bus bar comprises:
a fixing portion fixed to the fixing member;

extending portions individually extending from the fixing portion;

terminal portions extending from tips of the extending portions respectively and fixed and electrically connected to the substrate with the terminal portions inserted in terminal insertion holes of the substrate;

curved portions provided in the extending portions respectively; and recessed portions provided in the extending portions at positions toward the tips of the extending portions from the curved portions and formed in outer edges of the extending portions respectively, and wherein the fixing portion, extending portions, terminal portions, curved portions and recessed portions are formed as one piece, wherein the fixing portion has a screw through hole, and wherein the fixing portion is fixed to the fixing member by a screw threaded through the screw through hole into a protrusion of the fixing member located at a through hole of the substrate.

6. The bus bar fixing structure according to claim 5, wherein the terminal portions are formed in the outer edges of the extending portions by being bent at a right angle at the outer edges respectively.

* * * * *